(12) United States Patent
Lu et al.

(10) Patent No.: US 11,302,383 B2
(45) Date of Patent: Apr. 12, 2022

(54) DYNAMIC MEMORY WITH SUSTAINABLE STORAGE ARCHITECTURE

(71) Applicants: Etron Technology, Inc., Hsinchu (TW); Invention And Collaboration Laboratory Pte. Ltd., Singapore (SG)

(72) Inventors: Chao-Chun Lu, Taipei (TW); Bor-Doou Rong, Hsinchu County (TW); Chun Shiah, Hsinchu (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 0 days.

(21) Appl. No.: 16/354,187

(22) Filed: Mar. 15, 2019

(65) Prior Publication Data

US 2020/0185022 A1  Jun. 11, 2020

Related U.S. Application Data

(60) Provisional application No. 62/777,727, filed on Dec. 10, 2018.

(51) Int. Cl.
*G11C 11/4091* (2006.01)
*G11C 11/408* (2006.01)
*G11C 11/4074* (2006.01)

(52) U.S. Cl.
CPC ...... *G11C 11/4091* (2013.01); *G11C 11/4074* (2013.01); *G11C 11/4085* (2013.01)

(58) Field of Classification Search
CPC .. G11C 11/4091; G11C 11/4085; G11C 11/24

USPC ..................................................... 365/189.11
See application file for complete search history.

(56) References Cited

U.S. PATENT DOCUMENTS

| 5,353,255 | A | 10/1994 | Komuro | |
|---|---|---|---|---|
| 5,675,529 | A | 10/1997 | Poole | |
| 5,732,026 | A | 3/1998 | Sugibayashi | |
| 5,808,930 | A * | 9/1998 | Wada | G11C 5/14 365/51 |
| 5,978,255 | A | 11/1999 | Naritake | |
| 5,986,914 | A | 11/1999 | McClure | |
| 5,995,403 | A | 11/1999 | Naritake | |
| 6,141,259 | A | 10/2000 | Scott | |
| 6,272,054 | B1 | 8/2001 | Barth | |
| 6,344,990 | B1 | 2/2002 | Matsumiya | |
| 6,636,454 | B2 | 10/2003 | Fujino | |
| 8,559,220 | B2 * | 10/2013 | Yamazaki | H01L 27/1203 365/184 |
| 2003/0133321 | A1* | 7/2003 | Jo | G11C 11/4097 365/149 |
| 2004/0243758 | A1 | 12/2004 | Notani | |

(Continued)

*Primary Examiner* — Anthan Tran
(74) *Attorney, Agent, or Firm* — Winston Hsu

(57) ABSTRACT

The invention relates to DRAM with sustainable storage architecture. The DRAM comprises a DRAM cell with an access transistor and a storage capacitor, and a word-line coupled to a gate terminal of the access transistor. During the period between the word-line being selected to turn on the access transistor and the word line being unselected to turn off the access transistor, either a first voltage level or a second voltage level is stored in the DRAM cell, wherein the first voltage level is higher than a voltage level of a signal ONE utilized in the DRAM, and the second voltage level is lower than a voltage level of a signal ZERO utilized in the DRAM.

1 Claim, 8 Drawing Sheets

(56) References Cited

U.S. PATENT DOCUMENTS

| | | | |
|---|---|---|---|
| 2005/0247997 A1 | 11/2005 | Chung | |
| 2006/0221746 A1* | 10/2006 | Kang | G11C 11/406 365/222 |
| 2006/0233024 A1* | 10/2006 | Matick | G11C 11/4097 365/185.13 |
| 2007/0195624 A1 | 8/2007 | Song | |
| 2009/0251975 A1* | 10/2009 | Chung | G11C 7/062 365/189.11 |
| 2010/0329051 A1 | 12/2010 | Demone | |
| 2014/0254241 A1* | 9/2014 | Shiimoto | G11C 13/004 365/148 |
| 2016/0307616 A1* | 10/2016 | Rim | G11C 11/406 |

* cited by examiner

DYNAMIC MEMORY WITH SUSTAINABLE STORAGE ARCHITECTURE

CROSS REFERENCE TO RELATED APPLICATIONS

This application claims the benefit of U.S. Provisional Application No. 62/777,727, filed on Dec. 10, 2018 and entitled "Novel ON-OFF Designs of the Access Transistor in an DRAM's Cell", the contents of which are incorporated herein by reference.

BACKGROUND OF THE INVENTION

1. Field of the Invention

The present invention relates to dynamic memory, especially to dynamic memory with sustainable storage architecture.

2. Description of the Prior Art

The most widely used DRAM cell has one access transistor which has its source connected to the storage capacitor and its drain connected to the bit-line. The bit-line is connected to the first-stage cross-coupled sense amplifier which transfer signals to be READ out from the cell-array through the column switches to a second-stage sense amplifier which is connected to the I/O lines (also known as Data lines). During WRITE operation the signals driven by I/O buffers to be stabilized on the Data lines which further stabilize the data over the first-stage sense amplifier to make the right signals written into the storage capacitor through the access transistor. The access transistor is responsible for READ operation or WRITE operation of the correct data into the storage capacitor during active mode (that is, the access transistor is ON) but also avoids the stored signal loss when the access transistor is during the inactive mode (that is, the access transistor is OFF).

The access transistor is designed to have a high threshold voltage to minimize the leakage current through the transistor. But the shortcoming result is that the access transistor loses its performance when it is turned ON. As a result, the word-line needs to be bootstrapped or connected to a high VPP (usually from a word-line voltage source) to allow the access transistor to have high drivability for WRITE of signals into the storage capacitor. Such a high VPP is passed through a word-line driver to be loaded onto the word-line or the gate of the access transistor. Since the VPP is a high voltage stress over the access transistor, the dielectric material of the transistor (for example, an oxide layer or a High-K material) must be designed to be thicker than that used for transistors used in other support circuits or peripheral circuits of DRAM (such as command decoder, address decoder, and other I/O circuits, etc.) Therefore, the design of the access transistor faces a challenge of maintaining either high performance or high reliability, and presents a difficult trade-off between reliability and performance. The widely used access transistor design is more focused on accomplishing high reliability but must sacrifice the performance of the access transistor.

In a brief summary, regarding the conventional access transistor design, it has a high threshold voltage to reduce the leakage current to help long retention time of retaining charges in the storage capacitor, a thick gate dielectric material to sustain the high word-line voltage like VPP, and sacrifices the performance of the access transistor. As a result, WRITE or READ of the signal ONE which is usually referred to a VCC level takes longer times or cannot completely restore the signal ONE. That is, the WRITE time is longer to satisfy the full-signal VCC to be completely written into the storage capacitor.

The commonly used design of the DRAM cell could be illustrated in FIG. 1A. The DRAM cell includes an access transistor 11 and a capacitor 12. The gate of the access transistor 11 is coupled to a word-line (WL) and the cross-coupled sense amplifier 20 is coupled to the access transistor 11 through the bit-line (BL). The DRAM cell uses the access transistor 11 as a switch to control the charges to be stored from the bit-line (BL) into the capacitor in WRITE mode or to be transferred out to bit-line in READ mode, where multiple DRAM cells are connected to the bit-line, respectively. In this example, there are signals ONE (supposed as 1.2 V, and the signal ONE is usually the level voltage of VCCSA provided from the cross-coupled sense amplifier 20) and ZERO (supposed as 0V, and the signal ZERO is usually the level voltage of VSS provided from the cross-coupled sense amplifier 20) latched by a cross-coupled sense amplifier in READ mode by amplifying the signals transferred out by the cell signals on bit-lines, or these signals ONE and ZERO are written from the external to twist the sense amplifier for storing the right signals to the cells in WRITE mode.

FIG. 1B shows the related signal waveforms during access (READ or WRITE) operations of most current DRAMs. To give an example, a 25-nanometer DRAM cell has commonly the following parameters related to (surrounded with) the array design: the bit-line ONE voltage 1.2V, the word-line ON has the VPP up to 2.7V and the word-line OFF has the voltage about −0.3V, the threshold voltage of the cell is ranged around 0.7 to 0.9 V, the access transistor's dielectric must sustain the field strength under 2.7 V (under burn-in stress this number goes up to 3.4V for an acceptable reliability margin), and the Word-line driver device must also use the thick gate dielectric so that the performance must be sacrificed.

As shown in FIG. 1B, in the beginning, the storage capacitor of the DRAM is in the standby or inactive mode (that is, the access transistor is OFF), the voltage level of the word-line coupled to the gate of the access transistor is a standby negative voltage (−0.3V). The bit-line and bit-line bar are equalized at a voltage level of half-VCCSA between the ONE level at VCCSA=1.2V and the ZERO level of 0 V. When the storage capacitor enters the active mode (that is, the access transistor is ON), the voltage level of the word-line is raised from a standby negative voltage (−0.3V) and pulled up to a high level VPP (such as 2.7 V) which is much higher than the VCCSA (1.2 V) plus the threshold voltage VT of the access transistor (could be 0.7 or 0.8V) to provide sufficiently large drive over the access transistor's Gate-to-Source voltage (e.g. 2.7 V−1.2 V−0.8 V=0.7 V). The bit-line is coupled to the storage capacitor. The word-line is continuously ON at such a high voltage VPP for access operation (such as READ or WRITE). A RESTORE phase is proceeded following the access operation. During the RESTORE phase, the cross-coupled sense amplifier will recharge the storage capacitor based on the signal ONE or ZERO in the storage capacitor. After the RESTORE phase, the word-line is pulled down from VPP to the voltage of word-line at standby mode (−0.3 V) and the access transistor is in the inactive mode.

This high VPP voltage stress causes the access transistor to be designed with a thicker gate-oxide or gate-insulator than that used for the transistors in peripheral circuits, which degrades the access transistor performances such as the worse short-channel effects, the ON-OFF ratio of the transistor currents, and the swing slopes, etc. Moreover, although the threshold voltage is designed to be higher than that used in the transistors of peripheral circuits, the leakage current through the access transistor during the standby mode or inactive mode is still high to degrade the amount of stored charges for sensing. When the VCCSA is lower (such as 0.6V) in 12 nm or 7 nm FinFET process, the leakage problem in the standby mode or inactive mode will be worse.

SUMMARY OF THE INVENTION

Therefore, the present invention is to introduce DRAM with sustainable storage architecture. According to an aspect of the invention, the DRAM comprises a first sustaining voltage generator producing a first voltage level which is higher than a voltage level of a signal ONE utilized in the DRAM. The DRAM also comprises a DRAM cell comprising an access transistor and a storage capacitor, wherein the first voltage level of the first sustaining voltage generator is stored in the DRAM cell before the access transistor of the DRAM cell is turned off.

According to one aspect of the invention, the DRAM further comprises a word-line coupled to a gate terminal of the access transistor, wherein the word-line is selected to turn on the access transistor for a first period and a second period after the first period, and the first voltage level of the first sustaining voltage generator is stored in the DRAM cell during the second period. The DRAM cell is accessible during the first period. The DRAM further comprises a sense amplifier electrically coupled to the DRAM cell through a bit line, wherein the first sustaining voltage generator is connected to the sense amplifier during the second period, and the first voltage level of the first sustaining voltage generator is supplied to the DRAM cell through the sense amplifier and the bit line. Moreover, a voltage source is connected to the sense amplifier during the first period and disconnected with the sense amplifier during the second period, wherein the voltage level of the voltage source is equal to the voltage level of the signal ONE.

Another object of the invention is to provide a DRAM chip with sustainable storage architecture. The DRAM comprises a DRAM cell and a sense amplifier electrically coupled to the DRAM cell through a bit line. The DRAM cell comprises an access transistor and a capacitor. A first sustaining voltage generator and/or a second sustaining voltage generator is selectively coupled to the sense amplifier, wherein the first sustaining voltage generator produces a first voltage level which is higher than a voltage level of a signal ONE utilized in the DRAM chip, and the second sustaining voltage generator produces a second voltage level which is lower than a voltage level of a signal ZERO utilized in the DRAM chip. The first voltage level or the second voltage level is stored in the DRAM cell before the access transistor of the DRAM cell is turned off.

According to one aspect of the invention, the DRAM further comprises a word-line coupled to a gate terminal of the access transistor, wherein the word-line is selected to turn on the access transistor for a first period and a second period after the first period, and the first voltage level or the second voltage level is stored in the DRAM cell during the second period. The DRAM cell is accessible during the first period. The second sustaining voltage generator is connected to the sense amplifier during the second period, and the second voltage level of the second sustaining voltage generator is supplied to the DRAM cell through the sense amplifier and the bit line. Moreover, a voltage source is connected to the sense amplifier during the first period and disconnected with the sense amplifier during the second period, wherein the voltage level of the voltage source is equal to the voltage level of the signal ZERO.

It may be that one object of the invention is to provide a DRAM with sustainable storage architecture. According to an aspect of the invention, the DRAM comprises a DRAM cell with an access transistor and a storage capacitor, and a word line coupled to a gate terminal of the access transistor. During the period between the word-line being selected to turn on the access transistor and the word-line being unselected to turn off the access transistor, either a first voltage level or a second voltage level is stored in the DRAM cell, wherein the first voltage level is higher than a voltage level of a signal ONE utilized in the DRAM, and the second voltage level is lower than a voltage level of a signal ZERO utilized in the DRAM. Furthermore, according to an aspect of the invention, the DRAM further comprises a sense amplifier electrically coupled to the DRAM cell, wherein a first sustaining voltage generator producing the first voltage level and a second sustaining voltage generator producing the second voltage level are selectively coupled to the sense amplifier.

It may be that one object of the invention is to provide a DRAM chip with sustainable storage. According to an aspect of the invention, the DRAM chip comprises a first group of DRAM cells and a second group of DRAM cells, with each DRAM cell comprising an access transistor and a storage capacitor. The DRAM chip also comprises a first word-line coupled to a gate terminal of the access transistor of each DRAM cell in the first group of DRAM cells, and a second word-line coupled to a gate terminal of the access transistor of each DRAM cell in the second group of DRAM cells. During the period between the first word-line being selected to turn on the access transistor of each DRAM cell in the first group DRAM cells and the first word line being unselected to turn off the access transistor of each DRAM cell in the first group DRAM cells, each DRAM cell of the first group DRAM cells is supplied with either a first voltage level or a second voltage level, wherein the first voltage level is higher than a voltage level of a signal ONE utilized in the DRAM chip, and the second voltage level is lower than a voltage level of a signal ZERO utilized in the DRAM chip.

According to another aspect of the invention, the DRAM chip further comprises a first group of sense amplifiers electrically coupled to the first group of DRAM cells, wherein the first voltage level or the second voltage level is supplied to each DRAM cell of the first group of DRAM cells through the first group of sense amplifiers. Moreover, the DRAM chip further comprises a second group of sense amplifiers electrically coupled to the second group of DRAM cells, and when the first word-line is selected, the second word-line is unselected and the second group of sense amplifiers are coupled to a first voltage source and a second voltage source, and the voltage level of the first voltage source is equal to that of the signal ONE and the voltage level of the second voltage source is equal to that of the signal ZERO.

These and other objectives of the present invention will no doubt become obvious to those of ordinary skill in the art after reading the following detailed description of the preferred embodiment that is illustrated in the various figures and drawings.

DETAILED DESCRIPTION

A detailed description of the hereinafter described embodiments of the disclosed apparatus and method are presented herein by way of exemplification and not limitation with reference to the figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

This invention is to disclose DRAM with sustainable storage architecture, in which a sustaining voltage source is electrically coupled to the storage capacitor of the DRAM cell before the turn off of the access transistor, and the voltage level of the sustaining voltage source is higher than that of the regular signal ONE; or the voltage level of the sustaining voltage source is lower than that of the regular signal ZERO. DRAM operations (such as auto-precharge operation, RESTORE phase, refresh phase, and precharge phase) will make the selected DRAM cell to turn on the access transistor thereof. Thus, by coupling the aforesaid sustaining voltage source to the storage capacitor of the DRAM cell during the turn on stage of the access transistor, the storage capacitor can sustain for a longer period compared with conventional DRAM structure after the turn off stage of the access transistor, even if there is leakage current through the access transistor.

Example 1

Figure 1A:
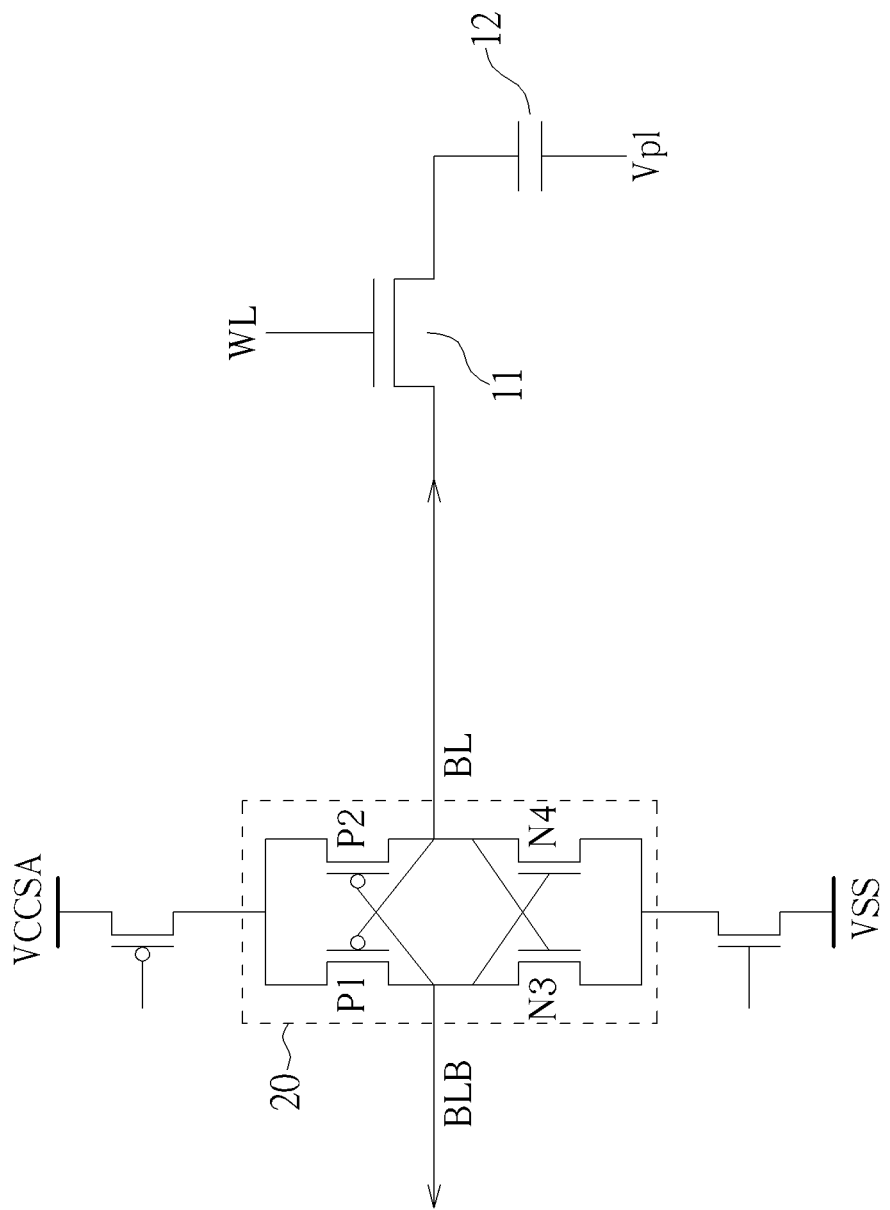
FIG. 1A illustrates commonly used design of the DRAM cell.
Figure 1B:
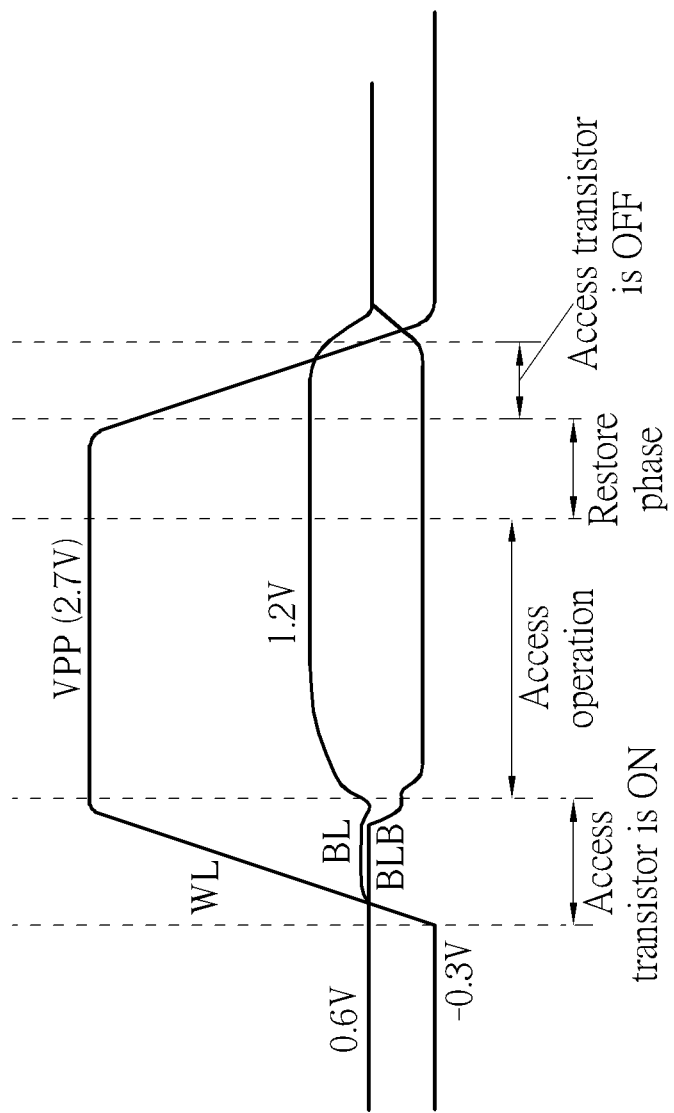
FIG. 1B illustrates the related signal waveforms during access (READ or WRITE) operation of most current DRAMs.
Figure 2:
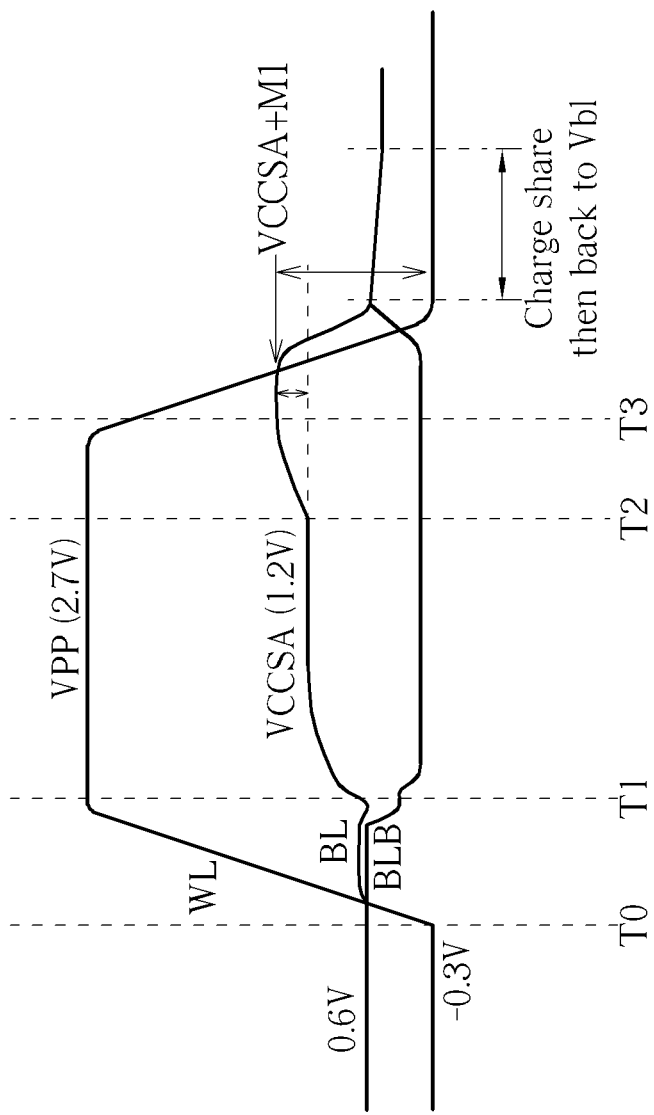
FIG. 2 illustrates the related signal waveforms during access (READ or WRITE) operation of the DRAM cell according to one embodiment of this invention.

FIG. 2 illustrates the related signal waveforms for access (READ or WRITE) operation of the DRAM cell according to one embodiment of this invention. By starting from the standby mode of the DRAM, the word-line WL is biased at −0.3 V in order to fully turn off the access transistor 11. In this embodiment, the VCCSA is set to 1.2V and VSS is set to 0V. The level of signal ONE is 1.2V and the level of signal ZERO is 0 V (GND) in this example. The bit-lines (BL and BLB) are equalized at a voltage level of 0.6V between the signal ONE level at VCCSA=1.2V and the signal ZERO level at VSS=0V.

At T0, the word-line voltage is ramping up from −0.3 V to 2.7 V which is much higher than the VCCSSA of 1.2 V and the access transistor's threshold voltage of 0.8 V to give enough driving for the turned-on access transistor 11 to transfer either the signal ONE or ZERO to the bit-lines. Until the signal is developed to a certain magnitude the sense amplifier 20 is activated to amplify the signal across the bit-line (BL) and bit-line bar (BLB). After T1, either READ operation (by amplifying the signals transferred out by the cell signals on bit-lines) or WRITE operation (these signals ONE and ZERO are written from the external to twist the sense amplifier 20 for storing the right signals to the DRAM cell) can be performed. Of course, besides READ or WRITE, other DRAM operations may be performed after T1. That is, the DRAM cell is accessible during the period between T1 and T2.

Figure 3A:
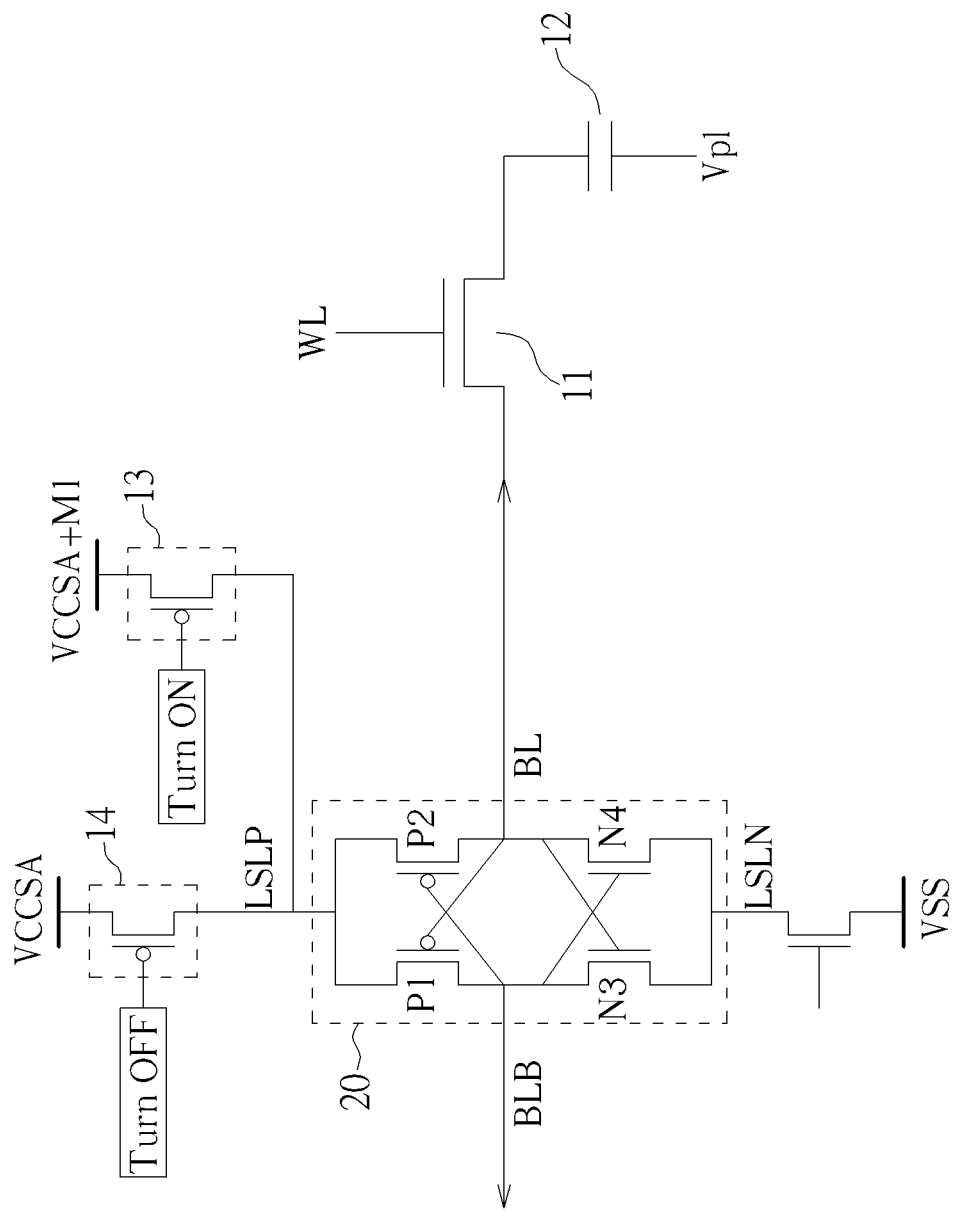
FIG. 3A shows a schematic circuit for the sense amplifier selectively coupled to a first sustaining voltage source which is higher than VCCSA.

After T2 during the RESTORE phase, the dielectric of the access transistor 11 is still loaded by VPP from word-line (WL) for a reasonably short time of restore. A first sustaining voltage source is intentionally coupled to the capacitor of the DRAM cell during this RESTORE phase. The voltage level of the first sustaining voltage source is higher than VCCSA of 1.2V (or the voltage level of signal ONE). This could be done by connecting or coupling the first sustaining voltage source (VCCSA+M1) to the sense amplifier 20 (such as, by turning on the switch 13), as shown in FIG. 3A which illustrates a schematic circuit of the sense amplifier 20 selectively coupled to the first sustaining voltage source. During this RESTORE phase, the original VCCSA voltage source is disconnected from the sense amplifier (such as, by turning off the switch 14), and the first sustaining voltage source (VCCSA+M1) will be connected to the sense amplifier 20, as shown in FIG. 3A. M1 could be a positive number such that the first sustaining voltage source (VCCSA+M1) is higher than VCCSA. In one example, M1 could be in the range of ⅓ VCCSA to ⅔ VCCSA, such as 0.6V. For example, when the signal ONE is originally in the storage capacitor, during this RESTORE phase, a voltage level of 1.2V+0.6V from the first sustaining voltage source is then supplied to the storage capacitor 12 through the sense amplifier 20. That is, before the turn off of the access transistor 11 at T3 (that is, the word-line WL is pulled down from VPP of 2.7V to the voltage of word-line at standby mode of −0.3V) in FIG. 2, the storage capacitor 12 is supplied with the voltage level of the first sustaining voltage source which is higher than that of the regular signal ONE (VCCSA). Thus, after the turn off of the access transistor 11, the storage capacitor 12 can sustain for a longer period compared with conventional DRAM structure even there is leakage current through the access transistor 11. In one embodiment, after the turn off of the access transistor 11 or after the RESTORE phase, the first sustaining voltage source (VCCSA+M1) could be disconnected from the sense amplifier 20. Additionally, the bit-line (BL) could be coupled to a bit-line voltage source with a voltage level of Vbl, such that the voltage level of the bit-line (BL) will be reset to Vbl, as shown in FIG. 2.

Figure 3B:
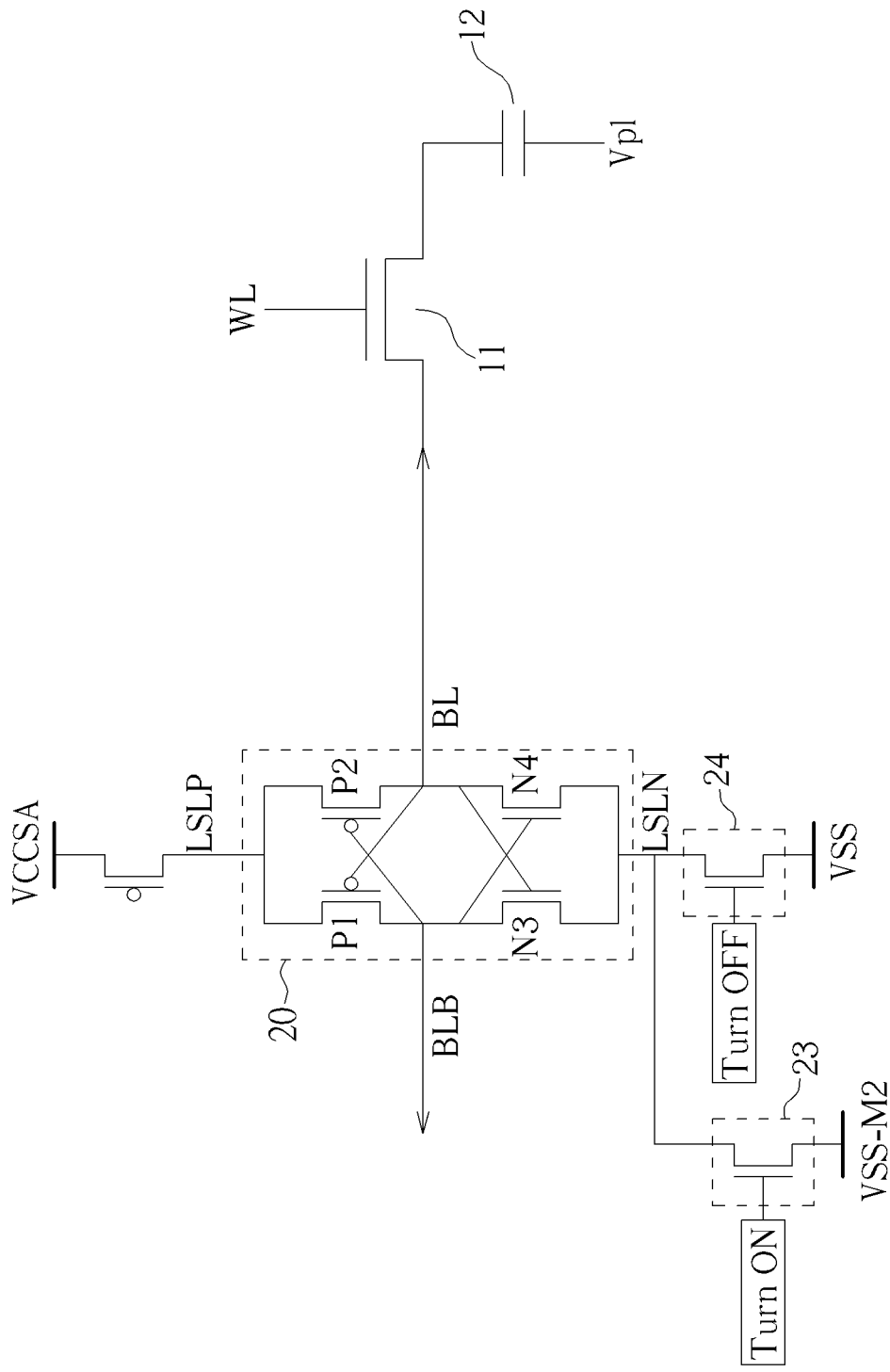
FIG. 3B shows a schematic circuit for the sense amplifier selectively coupled to a second sustaining voltage source which is lower than VSS.

In another embodiment, after T2 during the RESTORE phase, a second sustaining voltage source is intentionally coupled to the capacitor of the DRAM cell during RESTORE phase. The voltage level of the second sustaining voltage source is lower than voltage source VSS (0V or the voltage level of signal ZERO). This could be done by connecting the second sustaining voltage source (VSS-M2)

to the sense amplifier (such as, by turning on the switch 23), as shown in FIG. 3B. FIG. 3B illustrates a schematic circuit of the sense amplifier selectively coupled to a second sustaining voltage source (VSS-M2) which is lower than VSS, wherein M2 could be a positive number. In one example, M2 could be in the range of 0.4V~0.8V, such as 0.6V. Of course, when the second sustaining voltage source is coupled to the sense amplifier 20 during the RESTORE phase, the voltage source VSS is disconnected from the sense amplifier 20 (such as, by turning off the switch 24). When the signal ZERO is originally in the storage capacitor 12, during this RESTORE phase, a voltage level of −0.6V is then supplied to the storage capacitor. That is, before the turn off of the access transistor 11 at T3 (that is, the word-line WL is pulled down from VPP to the voltage of word-line at standby mode) in FIG. 2, the storage capacitor 12 is supplied with the voltage level of the second sustaining voltage source which is lower than that of the regular signal ZERO (VSS). In one embodiment, after the turn off of the access transistor 11 or after the RESTORE phase, the second sustaining voltage source (VSS-M2) could be disconnected from the sense amplifier 20.

Of course, in another embodiment, both the first and the second sustaining voltage sources could be intentionally coupled to the capacitor of the DRAM cell during RESTORE phase. Therefore, before the word-line WL is pulled down from VPP to the voltage of word-line at standby mode, when the signal ONE is originally in the storage capacitor, a voltage level of 1.2V+0.6V is then stored in the storage capacitor; or when the signal ZERO is originally in the storage capacitor, a voltage level of −0.6V is then stored in the storage capacitor.

Example 2

In order to reduce the leakage current to maintain the stored charges without being leaked through the access transistor, usually designs are made to let the access transistor have a very high threshold voltage. When the VCCSA is reduced to 0.6 V, the 7 nm or 5 nm process tri-gate or FinFET transistors are adopted for peripheral circuits in DRAM design, and the threshold voltage of these transistor can be scaled accordingly, such as to be reduced to 0.3 V. In this embodiment, the threshold voltage of the access transistor could be raised up to 0.5 to 0.6 V on purpose. So the leakage current from the storage capacitor is sharply reduced by at least 3~4 decades (=0.6−0.3~0.3 V, if the S-factor is 68 mV/decade, the leakage can be reduced 4 decades than that of the peripheral Tri-gate devices; if the threshold voltage is raised to 0.5 V, then the leakage current should be 2~3 decades). Raising the threshold voltage close to the VCCSA or at least more than 80% of the 0.6 V is proposed. In the embodiment, the gate-dielectric thickness of the access transistor (such as finfet or tri-gate transistor) is still maintained as that of the peripheral transistors without increasing its thickness, and then the high performance merit of using the tri-gate structure can be maintained.

Figure 4:
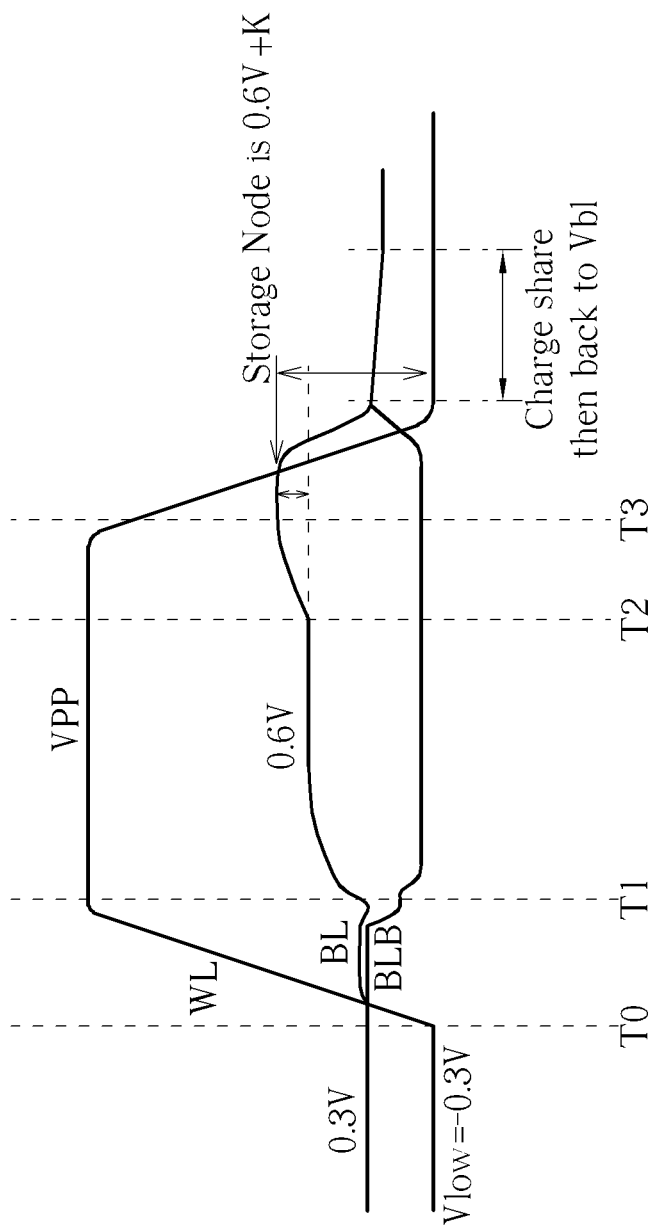
FIG. 4 illustrates the related signal waveforms of the DRAM cell according to another embodiment of this invention.

FIG. 4 illustrates the related signal waveforms of the DRAM cell according to another embodiment of this invention. The level of signal ONE is 0.6V and the level of signal ZERO is 0 V (GND) in this example. After T2 during the RESTORE phase, a first sustaining voltage source is intentionally coupled to the capacitor of the DRAM cell during RESTORE phase. The voltage level of the first sustaining voltage source is higher than VCCSA of 0.6V (or the voltage level of signal ONE). This could be done by connecting the first sustaining voltage source (VCCSA+K) to the sense amplifier, wherein K could be a positive number. In one example, K could be in the range of ⅓ VCCSA to ⅔ VCCSA, such as 0.3 V or 0.4 V. Therefore, when the signal ONE of 0.6V is originally in the storage capacitor, during this RESTORE phase, a voltage level of 0.6V+0.4V is then supplied to the storage capacitor. That is, before the turn off of the access transistor at T3 (that is, the word-line WL is pulled down from VPP to the voltage of word-line at standby mode) in FIG. 4, the storage capacitor is supplied with the voltage level of the first sustaining voltage source which is higher than that of the regular signal ONE (VCCSA of 0.6V). Therefore, after the word-line WL is pulled up to VPP but before the word-line is pulled down to the standby or inactive mode, a voltage level of 1V is then stored in the storage capacitor when the signal ONE is originally in the storage capacitor. In one embodiment, after the RESTORE phase, the bit-line (BL) and bit-line bar (BLB) could be coupled to a bit-line voltage source with a voltage level of Vbl, such that the voltage level of the bit-line (BL) and the voltage level of bit-line bar (BLB) will be reset to Vbl, as shown in FIG. 4.

Of course, as previously mentioned, before the word-line WL is pulled down from VPP to the voltage of word-line at standby mode, when the signal ZERO is originally in the storage capacitor, a voltage level of the second sustaining voltage source could be then stored in the storage capacitor, wherein the voltage level of the second sustaining voltage source is lower than the signal ZERO, such as −0.4V.

Example 3

Figure 5:
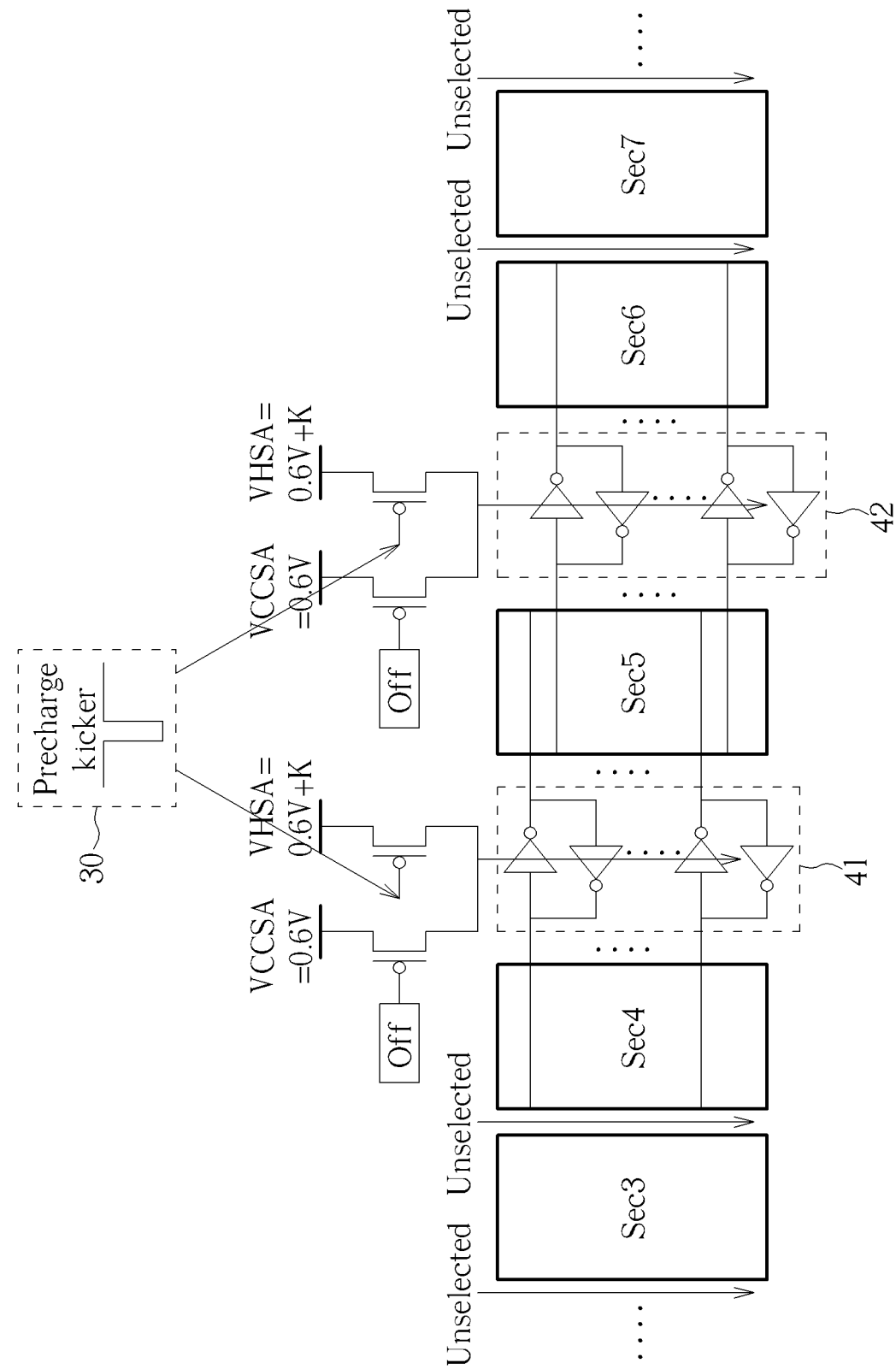
FIG. 5 shows the functional block diagrams of one embodiment of this invention regarding precharge operation.

FIG. 5 shows another embodiment regarding the circuit and functional block diagrams for precharge operation. In this embodiment, the VCCSA is set to 0.6V and VSS is set to 0V. In the precharge operation, all the DRAM cells connected to the selected word line(s) in memory section 5 ("Sec 5") will be precharged, and those DRAM cells connected to unselected word lines in other memory sections (such as "Sec4", "Sec6", etc.) will be at idle state.

The sense amplifiers 41 and 42 coupled to the DRAM cells which are connected to the selected word line(s) will be kicked to a third sustaining voltage source VHSA (0.6V+K) by the precharge kicker 30, so that a stronger drain-to-source electrical field can accelerate the signal restored to the cell. The third sustaining voltage source VHSA is higher than the VCCSA (0.6V) about few hundred mV, for example 0.3V or 0.4V. Moreover, before the selected word line(s) is OFF (that is, the access transistors of DRAM cells coupled to the selected word line(s) are OFF), the voltage level of 0.6V+ 0.4V which is higher than that of the original signal ONE could be then stored in the storage capacitors. On the other hand, the sense amplifiers coupled to the DRAM cells which are connected to the unselected word line(s) will not be kicked up and are still coupled to VCCSA.

Figure 6:
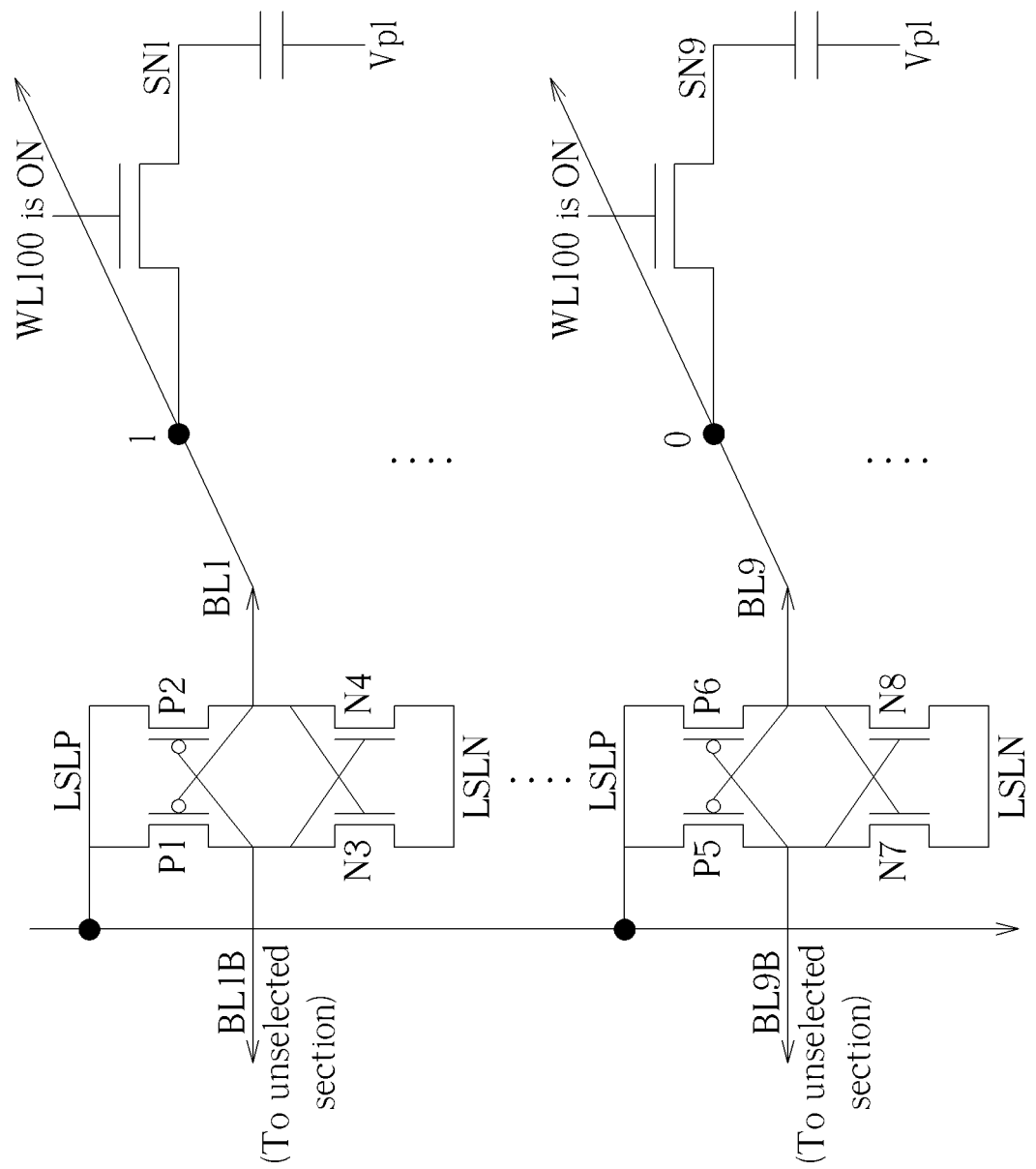
FIG. 6 illustrates the operation of the sense amplifiers for the precharge operation according to this invention.

FIG. 6 explains the operation of the sense amplifiers for the precharge phase, and the meaning for the symbols used in FIG. 6 is as follows:

VCCSA: Bit Line Sense Amplifiers Voltage
VHSA: the third sustaining voltage source
LSLP: Selected Bit Line Sense Amplifiers High Voltage
LSLN: Selected Bit Line Sense Amplifiers Low Voltage
Vpl: Plate Voltage
SN: Storage Node
WL: Word Line
BL: Bit Line
Vsg1,2: Source to Gate Voltage of P1,P2
Vgs3,4: Gate to Source Voltage of N3,N4

Vsg5,6: Source to Gate Voltage of P5,P6
Vgs7,8: Gate to Source Voltage of N7,N8

Referring to FIG. 6, the word-line WL100 is coupled to multiple storage nodes, such as SN1 and SN9. When the signal ONE (0.6V) is stored in the storage node SN1 which is connected to word-line WL100, after the precharge command is issued and the word-line WL100 is selected (that is, the word-line is ON), the LSLP of the sense amplifier is coupled to the VHSA (1.0V), therefore LSLP is kicked from 0.6V to 1.0V, and LSLN stays in 0V. Thus, transistor P1 of the sense amplifier is OFF and Vsg1=0V. Also, transistor P2 of the sense amplifier is ON and Vsg2 is kicked from 0.6V to 1.0V, and 1.0V is fully charged through bit-line BL1 to storage node SN1. Meanwhile, transistor N3 of the sense amplifier is ON and the Vgs3 is also kicked from 0.6V to 1.0V. Furthermore, transistor N4 of the sense amplifier is OFF and the Vgs4 is 0V.

When the signal ZERO (0V) is stored in the storage node SN9 which is connected to the word-line WL100, after the precharge command is issued and the word-line WL100 is selected, the sense amplifier is coupled to the VHSA (1.0V), therefore LSLP is kicked from 0.6V to 1.0V, and LSLN stays in 0V. Thus, transistor P5 of the sense amplifier is ON and Vsg5 is kicked from 0.6V to 1.0V. Also, transistor P6 of the sense amplifier is OFF and Vsg2 is 0V. Meanwhile, transistor N7 of the sense amplifier is OFF and the Vgs7 is 0V. Furthermore, transistor N8 of the sense amplifier is ON and the Vgs8 is kicked from 0.6V to 1.0V, and 0V is restored strongly through bit-line BL9 to storage node SN9. Of course, as previously mentioned, when the signal ZERO is originally in the storage capacitor, LSLN could be coupled to another sustaining voltage source VLSN (0V-K) during the precharge phase. VLSN is lower than the voltage level of the signal ZERO, and in this case, VLSN could be −0.4V. Then −0.4V is restored strongly through bit-line BL9 to storage node SN9 during the precharge phase.

In another embodiment, coupling the first sustaining voltage source which is higher than the voltage level of signal ONE to the sense amplifier (or DRAM storage cell) could be applied to the refresh operation or other operation (such as READ/WRITE with auto precharge operation), as long as the first sustaining voltage source is coupled to the sense amplifier (or DRAM storage cell) before the word-line coupled to the DRAM storage cell is OFF. Also coupling the second sustaining voltage source which is lower than the voltage level of signal ZERO to the sense amplifier (or DRAM storage cell) could be applied to the refresh operation or other operation, as long as the second sustaining voltage source is coupled to the sense amplifier (or DRAM storage cell) before the word-line coupled to the DRAM storage cell is OFF.

To summarize the statements mentioned above, this invention discloses DRAM with sustainable storage architecture. A first sustaining voltage which is higher than the voltage level of signal ONE could be restored or stored to the DRAM storage cell before the access transistor of the DRAM storage cell is OFF (or the word-line coupled to the DRAM storage cell is OFF). Also a second sustaining voltage source which is lower than the voltage level of signal ZERO could be restored or stored to DRAM storage cell before the access transistor of the DRAM storage cell is OFF (or the word-line coupled to the DRAM storage cell is OFF). Thus, after the turn off of the access transistor, the storage capacitor can sustain for a longer period compared with conventional DRAM structure even if there is leakage current through the access transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DRAM chip, comprising:
   a first supplying voltage generator generating a voltage level corresponding to a signal ONE utilized in the DRAM chip;
   a first sustaining voltage generator generating a first voltage level which is higher than the voltage level of the signal ONE utilized in the DRAM chip;
   a DRAM cell comprising an access transistor and a storage capacitor; and
   a sense amplifier coupled to the DRAM cell through a bit line;
   wherein the first supplying voltage generator is selectively coupled to the sense amplifier through a first switch, and the first sustaining voltage generator is selectively coupled to the sense amplifier through a second switch;
   wherein during a turning-off period of the access transistor of the DRAM cell, the first switch is turned off and the second switch is turned on, the first sustaining voltage generator is coupled to the bit line and coupled to the storage capacitor of the DRAM cell, and the voltage of the bit line is higher than the voltage level of the first supplying voltage generator corresponding to a signal ONE.

* * * * *